United States Patent [19]

Kinoshita et al.

[11] Patent Number: 5,744,796
[45] Date of Patent: Apr. 28, 1998

[54] MASS SPECTROMETER AND RADICAL MEASURING METHOD

[75] Inventors: Keizo Kinoshita; Seiji Samukawa, both of Tokyo; Tetsu Mieno, Shizuoka, all of Japan

[73] Assignee: NEC Corporation, Tokyo, Japan

[21] Appl. No.: 744,366

[22] Filed: Nov. 7, 1996

[30] Foreign Application Priority Data

Nov. 8, 1995 [JP] Japan ................................. 7-289723

[51] Int. Cl.⁶ ........................................... H01J 49/26
[52] U.S. Cl. ........................... 250/282; 250/281; 250/286
[58] Field of Search ........................... 250/282, 281, 250/286

[56] References Cited

U.S. PATENT DOCUMENTS

| | | | |
|---|---|---|---|
| 5,015,848 | 5/1991 | Bomse et al. | 250/281 |
| 5,340,983 | 8/1994 | Deinzer et al. | 250/281 |
| 5,493,115 | 2/1996 | Deinzer et al. | 250/281 |

OTHER PUBLICATIONS

Sugai, et al., Journal of Vacuum Science & Technology 10 (1992) Jul./Aug., No. 4, Pt. I, Appearance mass spectrometry of neutral radicals in radio frequency plasmas, pp. 1193–1200.

Kinoshita, et al., LSI Basic Research Lab., Microelectronics Research Labs., NEC Corp., Residence Time Effects on Dissociation in High Density $CF_4$ Plasma, pp. 104–105.

*Primary Examiner*—Jack I. Berman
*Attorney, Agent, or Firm*—Laff, Whitesel, Conte & Saret, Ltd.

[57] ABSTRACT

In a mass spectrometer, a DC power supply amplifier is additionally provided in a circuit for generating an accelerating voltage of an electron beam for ionizing radicals. A "potential for ionization of radicals" is applied as a reference voltage of the accelerating voltage of the radical ionizing electron beam, and an output signal of the mass spectrometer is measured as a background signal strength. Then, the DC power supply amplifier is controlled to alternately supply the "potential for ionization of radicals" and a "potential slightly lower than a potential for dissociative ionization of parent gas or dissociative ionization of parent radicals", as the accelerating voltage of the radical ionizing electron beam. A difference between the background signal strength and the output signal of the mass spectrometer when the "potential slightly lower than a potential for dissociative ionization of parent gas or dissociative ionization of parent radicals" is applied as the accelerating voltage of the radical ionizing electron beam, reflects the density of radicals.

3 Claims, 4 Drawing Sheets

MASS SPECTROMETER AND RADICAL MEASURING METHOD

BACKGROUND OF THE INVENTION

1. Field of the Invention

The present invention relates to a mass spectrometer and a method for measuring radicals.

2. Description of Related Art

A radical measuring method using a mass spectrometer is utilized in a means for measuring the density of radicals in plasma created by a plasma generating apparatus for an LSI manufacturing. A stable mass production of LSIs can be realized, by measuring the change of the density of radicals in plasma, by evaluating the running condition and the degree of stability in an LSI manufacturing apparatus, and by changing the running condition of the LSI manufacturing apparatus if necessary.

One of methods for measuring a relative density change of radicals in plasma used for an LSI manufacturing, utilizes a mass spectrometer. In this method, an appearance mass spectrometry is used in which a signal for only radicals is extracted by utilizing a difference between the "potential for ionization of radicals" and the "potential for dissociative ionization of parent gas or parent radicals", in an ion source part of the mass spectrometer. One example of this appearance mass spectrometry is disclosed by H. Sugai et al, "Appearance mass spectrometry of neutral radicals in radio frequency plasma", Journal of Vacuum Science and Technology, A 10(4), Pages 1193–1200, July/August 1992, the disclosure of which is incorporated by reference in its entirety into this application.

This appearance mass spectrometry can be applied in the case that the potential for ionization of certain radicals is lower than the potential for dissociative ionization of parent gas, which creates the radicals in question as the result of the dissociation, and is also lower than the potential for dissociative ionization of the other radicals. The principle of this is that, since the potential for ionization of certain radicals is lower than the potential for dissociative ionization of parent gas (which creates the radicals in question as the result of the dissociation) and the other radicals which have a molecular weight heavier than that of the radicals in question, only the radicals in question are ionized while avoiding dissociative ionization, by utilizing the difference of ionization potential.

In the prior art, in order to observe the change of a signal strength for radicals in relation to a plasma generation condition by use of the appearance mass spectrometry, a radical measurement was made in such a manner that, (1) an accelerating voltage for an electron beam in an ion source of the mass spectrometer is elevated gradually but in a stepped fashion from the potential for ionization of radicals, and output signals outputted from the mass spectrometer at respective different voltages are averaged and the averaged value thus obtained is plotted to depict the averaged value line on a graph, (2) the accelerating voltage is elevated until a potential slightly lower than the potential for dissociative ionization of parent gas or the other radicals, while an output signal of the mass spectrometer is plotted on the graph, (3) the area between the plotted (curved) line thus obtained and the averaged value line is calculated as the value reflecting the radical density. An example of this plotted graph is shown in FIG. 1. In addition, an example of this measurement is disclosed in K. Kinoshita et al, "RESIDENCE TIME EFFECTS ON DISSOCIATION IN HIGH DENSITY CF4 PLASMA", Digest of Papers, Microprocess '95, the 8th International Microprocess Conference, Lecture No. 18B-2-8, pages 104–105, the Japan Society of Applied Physics, 1995, the disclosure of which is incorporated by reference in its entirety into this application. In the prior art method, since it is required that the averaged value becomes almost constant value, a time of 10 seconds to 100 seconds is required for averaging.

As seen from the above, the conventional radical measurement based on the appearance mass spectrometry using the conventional mass spectrometer cannot measure, in real time, the radicals in plasma of the LSI manufacturing equipment, which requires an "in site" measurement, because a considerable time is required until the value reflecting the radical density is obtained, not only since it is necessary to average the signal outputted from the mass spectrometer over a certain constant time, but also since a numerical calculation processing is required to obtain the area of the portion between the plotted curved line and the averaged value line. Therefore, the conventional method is not suitable to a real-time measurement or a short-time measurement, which are required in the LSI manufacturing process.

SUMMARY OF THE INVENTION

Accordingly, it is an object of the present invention to provide a radical measurement method capable of realizing a real-time measurement or a short-time measurement, which are required in the LSI manufacturing process.

Another object of the present invention is to provide an improved mass spectrometer used for the above mentioned real-time radical measurement method.

The above and other objects of the present invention are achieved in accordance with the present invention by a mass spectrometer configured to ionize radicals by an electron beam, and to estimate the amount of the radicals by amplifying secondary electrons generated by collision of ions or electrical charges of the ions themselves, wherein the improvement comprises a DC power supply amplifier provided in a circuit for generating an accelerating voltage of an electron beam for ionizing radicals, and for supplying the electron beam accelerating voltage changing between two different voltages in the form of a pulse.

According to another aspect of the present invention, there is provided a radical measurement method based on an appearance mass spectrometry of picking up a signal indicative of only radicals in plasma, by bringing an ionizing electron beam accelerating voltage of a mass spectrometer to a potential between the "potential for ionization of radicals" and the "potential for dissociative ionization of parent gas or dissociative ionization of parent radicals", wherein the improvement is that a signal outputted from the mass spectrometer is picked up while repeatedly changing the ionizing electron beam accelerating voltage, in the form of a pulse, between a first voltage not lower than the "potential for ionization of radicals" and a second voltage higher than the first voltage but lower than the "potential for dissociative ionization of parent gas or dissociative ionization of parent radicals", and the density of the radicals is determined from the difference in the signal outputted from the mass spectrometer between when the first voltage is applied and when the second voltage is applied.

According to still another aspect of the present invention, there is provided a radical measurement method based on an appearance mass spectrometry of picking up a signal indicative of only radicals in plasma, by bringing an ionizing electron beam accelerating voltage of a mass spectrometer to a potential between the "potential for ionization of radicals" and the potential for dissociative ionization of parent gas or dissociative ionization of parent radicals, wherein the improvement is that a measurement reference level of the ionizing electron beam accelerating voltage is set to an intermediate voltage between the "potential for ionization of radicals" and a "potential slightly lower than the potential for dissociative ionization of parent gas or dissociative ionization of parent radicals", and thereafter, a signal outputted from the mass spectrometer is picked up while repeatedly changing the ionizing electron beam accelerating voltage, in the form of a pulse, between a first voltage lower than the measurement reference level but not lower than the "potential for ionization of radicals" and a second voltage higher than the measurement reference level but lower than the "potential for dissociative ionization of parent gas or dissociative ionization of parent radicals", and the density of the radicals is determined from the difference in the signal outputted from the mass spectrometer between when the measurement reference level is applied and when the first voltage is applied and from the difference in the signal outputted from the mass spectrometer between when the measurement reference level is applied and when the second voltage is applied.

As seen from the above, the mass spectrometer in accordance with the present invention, the DC power supply amplifier is used to control the accelerating voltage of the electron beam for ionizing radicals in an ion source of the mass spectrometer.

In the radical measurement method in accordance with the present invention, the "potential for ionization of radicals" is used as a reference level of the accelerating voltage of the electron beam in the ion source of the mass spectrometer, and at this time, a signal outputted from the mass spectrometer is obtained as a background signal strength. Then, the DC power supply amplifier is driven to pulsate at a high frequency the accelerating voltage of the ionizing electron beam between the "potential for ionization of radicals" and the "potential slightly lower than the potential for dissociative ionization of parent gas or dissociative ionization of parent radicals". A difference between the strength of the signal outputted from the mass spectrometer at this time and the above mentioned background signal strength is used as the value reflecting the density of radicals.

Alternatively, a measurement reference level of the ionizing electron beam accelerating voltage is set to an intermediate voltage between the "potential for ionization of radicals" and a "potential slightly lower than the potential for dissociative ionization of parent gas or dissociative ionization of parent radicals", and at this time, a signal outputted from the mass spectrometer is obtained as a background signal strength. Then, the DC power supply amplifier is driven to pulsate at a high frequency the accelerating voltage of the ionizing electron beam between the "potential for ionization of radicals" and the "potential slightly lower than the potential for dissociative ionization of parent gas or dissociative ionization of parent radicals". A difference between the above mentioned background signal strength and the strength of the signal outputted from the mass spectrometer when the accelerating voltage of the ionizing electron beam is the "potential for ionization of radicals" and a difference between the above mentioned background signal strength and the strength of the signal outputted from the mass spectrometer when the accelerating voltage of the ionizing electron beam is the "potential slightly lower than the potential for dissociative ionization of parent gas or dissociative ionization of parent radicals", are used as the value reflecting the density of radicals.

In general, the signal output of the mass spectrometer when the potential for ionization is caused to change, is depicted as shown in the graph of FIG. 2. Therefore, a relative density change of radicals in plasma is estimated on the basis of the amount of change in strength of the signal outputted from the mass spectrometer when the potential for ionization is caused to change from the "potential for ionization of radicals" to a "potential slightly lower than the potential for dissociative ionization of parent gas or dissociative ionization of parent radicals". In the present invention, since the potential for ionization is caused to change in the form of a pulse between the above mentioned two potentials by action of the DC power supply amplifier, the difference in the signal outputted from the mass spectrometer between respective applications of the above mentioned two potentials can be measured on the condition that the background strength is the same. Since the background is the same, a signal obtained from the difference in the signal strength between the respective applications of the above mentioned two potentials, reflects only the density of radicals.

The above and other objects, features and advantages of the present invention will be apparent from the following description of preferred embodiments of the invention with reference to the accompanying drawings.

DESCRIPTION OF THE PREFERRED EMBODIMENTS

First Embodiment

Figure 3:
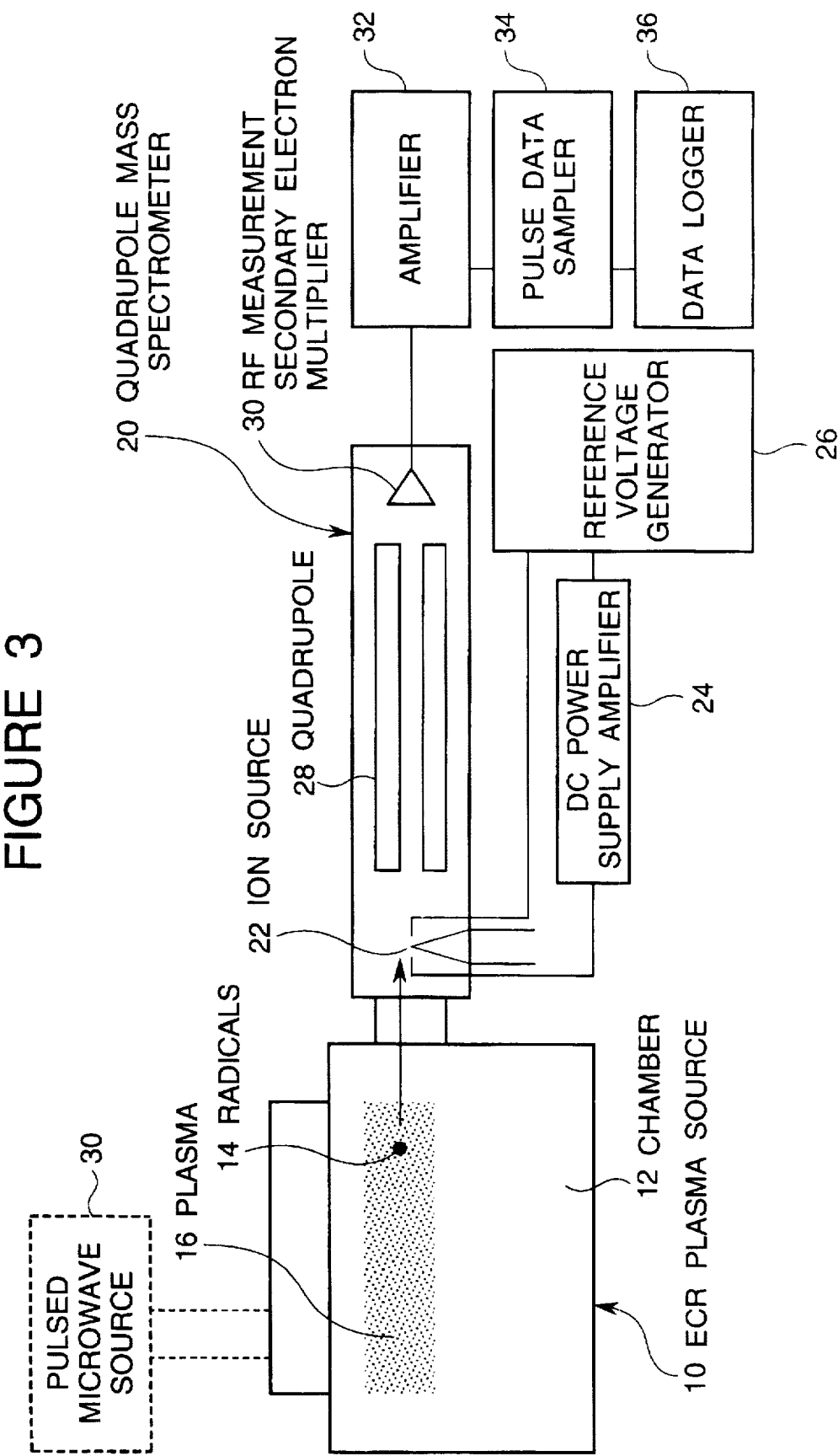
FIG. 3 is a block diagram of an embodiment of the mass spectrometer in accordance with the present invention.

Referring to FIG. 3, there is shown a block diagram of an embodiment of the mass spectrometer in accordance with the present invention.

The shown system includes an ECR plasma source 10 having a chamber 12, and a quadrupole mass spectrometer 20 coupled to the chamber 12 of the ECR plasma source 10. The ECR plasma source 10 and the quadrupole mass spectrometer 20 are similar to those shown in the above referred K. Kinoshita et al lecture's summary, and well known to persons skilled in the art, and therefore, a detailed description will be omitted.

In brief, the quadrupole mass spectrometer 20 includes an ion source 22, which receives an electric voltage supplied through a DC power supply amplifier 24 from a reference voltage generator 26 The quadrupole mass spectrometer 20 also includes a quadrupole 28 and a RF measurement secondary electron multiplier 30 (which is constituted of for example a photon counter and which is configured to amplify secondary electrons generated by collision of ions or electrical charges of the ions themselves). An output of the RF measurement secondary electron multiplier 30 is connected to an amplifier 32, which in turn has an output connected to a pulse data sampler 34 (for example, is constituted of a box car recorder). An output of the pulse data sampler 34 is connected to a data logger 36.

In the following, an measurement example of measuring CF3 radicals (mass number=69), as radicals 14 to be measured, in a plasma 16 of a CF4 gas within the chamber 12 of the ECR plasma source 10, will be described.

First, 10.3 V was set as an ionization potential of CF3 radicals, which constitute a reference, and the reference voltage generator 26 was set to generate a reference voltage of 10.3 V, which is supplied through the DC power supply amplifier 24 to the ion source 22. Under this condition, the CF4 plasma was generated, and the measurement of CF3 radicals was conducted.

Then, the DC power supply amplifier 24 was adjusted to alternately supply 15.5 V (upper limit voltage) which is just below 15.9 V which is a potential for dissociative ionization of a parent gas CF4, and 10.3 V which is the reference voltage. Namely, a voltage changing between 15.5 V and 10.3 V in the form of a pulse was supplied to the ion source 22, as shown in a middle of FIG. 4A, and the measurement of CF3 radicals was conducted by picking up a signal in synchronism with the stepped transition and during a period that 15.5 V was supplied. In this example, a pulse width was 10 μs. In other words, the DC power supply amplifier 24 superposes a voltage pulse of 5.2 V having the pulse width of 10 μs and the duty of 50%, on the reference voltage of 10.3 V supplied from the reference voltage generator 26.

In synchronism with the pulsed voltage having the pulse width of 10μs, an output signal of the mass spectrometer 20 was picked up through the RF measurement secondary electron multiplier 30, the amplifier 32, the pulse data sampler 34 and the data logger 36. A signal of radicals is weak when the applied voltage is low and strong when the applied voltage is high. The graph shown in a bottom of FIG. 4A illustrates an output signal strength pattern of the quadrupole mass spectrometer 20 observed in this example.

Figure 4A:
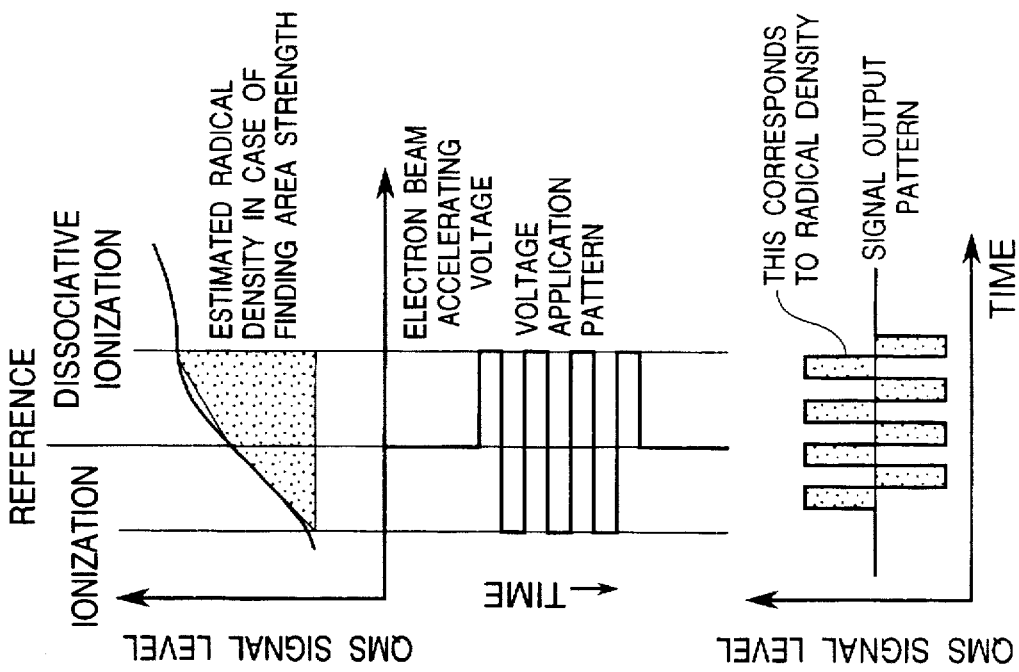
FIGS. 4A and 4B illustrate examples of an ionization potential and a signal output of the mass spectrometer when the radical measurement method in accordance with the present invention is carried out by using the mass spectrometer in accordance with the present invention.
Figure 4B:
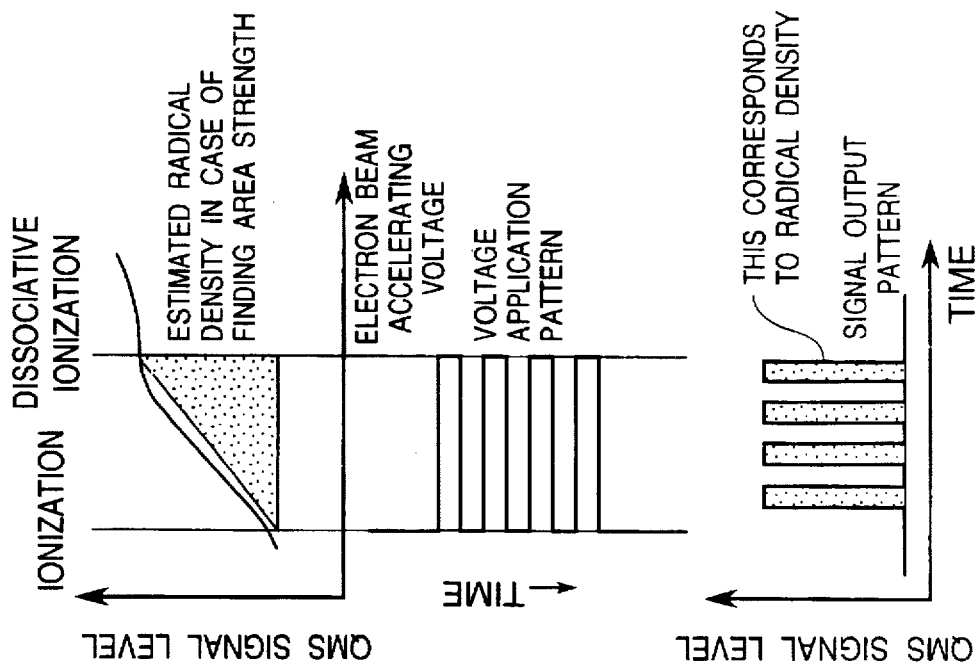

In the graph shown in the bottom of FIG. 4A, since the signal strength can be considered to be indicative of the density of the radicals to be measured, the difference in the signal strength when 15.5 V is applied and when 10.3 V is applied, reflects the density of the radicals to he measured (which does not include a product of the dissociation of the parent gas within the mass spectrometer). Alternatively, if the area strength reflects the density of radicals, it can be considered that the area of the rectangular pulses reflects the reflects the density of radicals. If either of these two indexes reflecting the density of radicals is used, the same result can be obtained as seen from FIG. 4, and in addition, the signal reflecting the density of radicals can be obtained at a high speed, since it requires no averaging processing which was required in the prior art.

Second Embodiment

As a modified embodiment of the first Embodiment, the reference voltage generator 26 was set to generate a reference voltage which is an intermediate voltage between a "potential for ionization of radicals" to be measured and a "potential slightly lower than a potential for dissociative ionization of a parent gas or dissociative ionization of parent radicals". In the case of measuring CF3 radicals, the reference voltage generator 26 was set to generate a reference voltage which is an intermediate voltage between 10.3 V and 15.5 V. In this condition, the output of the mass spectrometer was measured.

Then, the DC power supply amplifier 24 was adjusted to alternately supply the "potential for ionization of radicals" to be measured (lower limit voltage) and the "potential slightly lower than a potential for dissociative ionization of a parent gas or dissociative ionization of parent radicals" (upper limit voltage). Namely, the DC power supply amplifier 24 was adjusted to alternately supply the lower limit voltage of 10.3 V and the upper limit voltage of 15.5 V. Namely, a voltage changing between 15.5 V and 10.3 V in the form of a pulse was supplied to the ion source 22, as shown in a middle of FIG. 4B, and the output of the mass spectrometer was measured.

As a result, as shown in a bottom of FIG. 4, the difference in the output signal strength of the mass spectrometer between when the intermediate voltage is applied and when the "potential for ionization of radicals" is applied, as well as the difference in the output signal strength of the mass spectrometer between when the intermediate voltage is applied and when the "potential slightly lower than a potential for dissociative ionization of a parent gas or dissociative ionization of parent radicals" is applied, is measured. Therefore, similarly to the first embodiment, the signal reflecting the density of radicals can be obtained at a high speed, since it requires no averaging processing which was required in the prior art.

Figure 1:
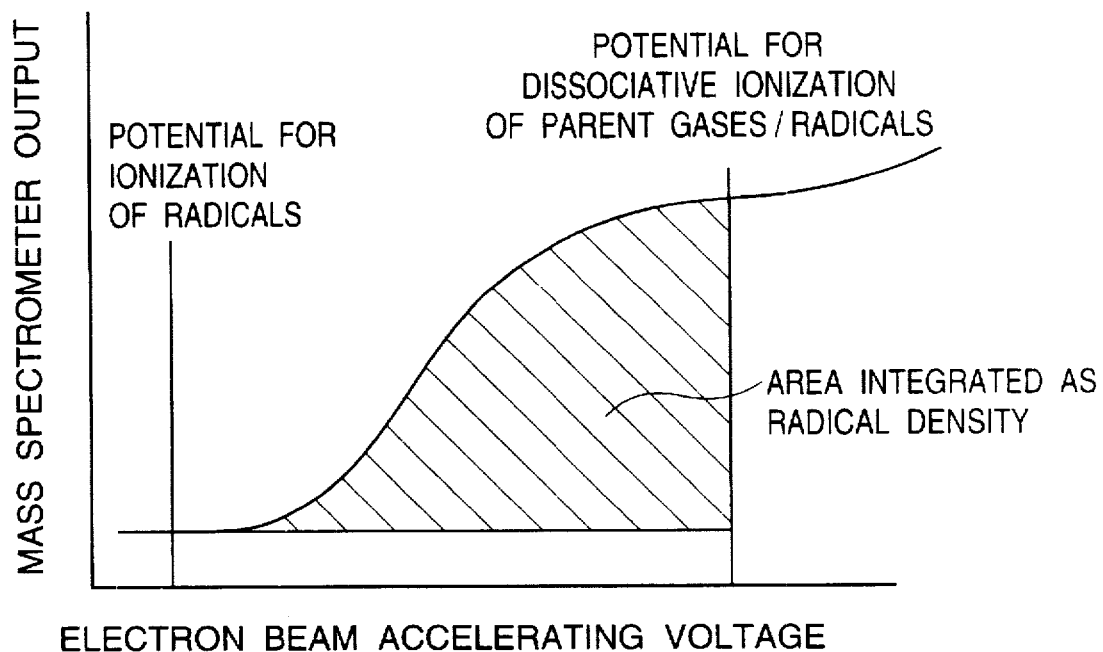
FIG. 1 is one example of the plotted graph obtained in the conventional radical measurement method using the conventional mass spectrometer.
Figure 2:
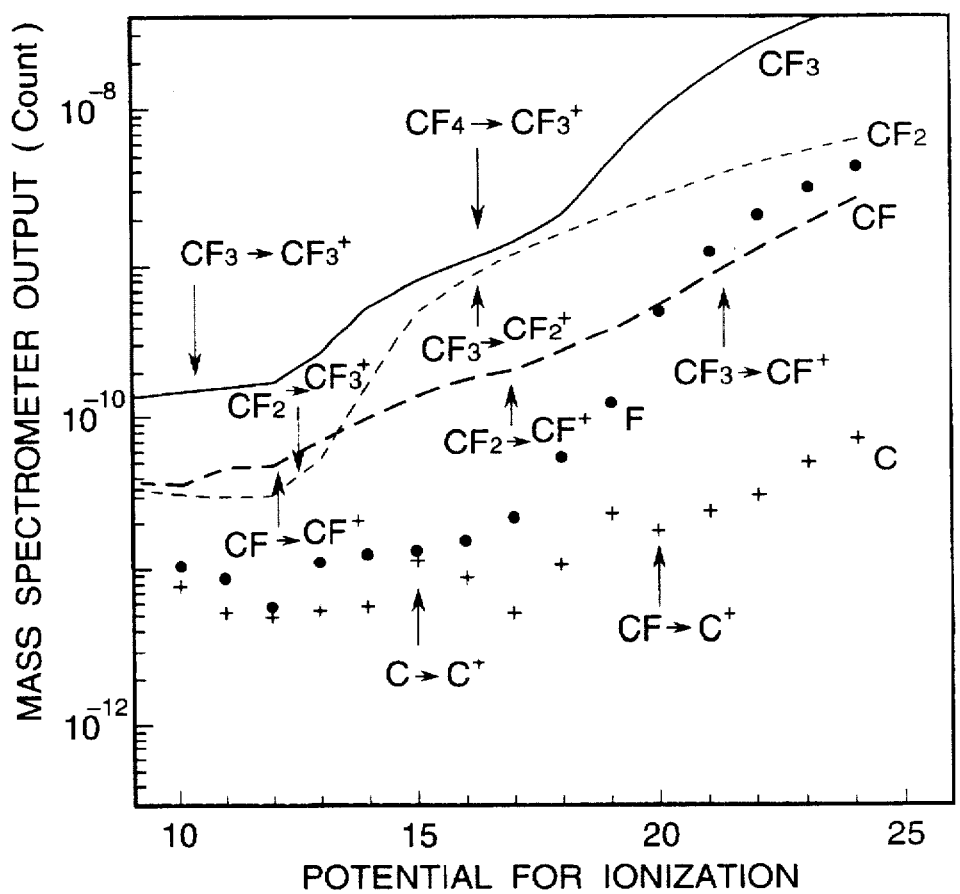
FIG. 2 is a graph illustrating measurement examples of the signal output of the mass spectrometer and the potential for ionization, of different radical species.

The second embodiment requires a measurement time somewhat longer than that required in the first embodiment. However, in the case that the signal strength reflecting the density of radicals is indicated by the area below of the curved line as shown in FIG. 1, since the second embodiment calculates the area of a section which is finer than that in the first embodiment, the second embodiment can have a measurement precision higher than that of the first embodiment. In other words, the second embodiment equivalently measure the dot-patterned area (consisting of one triangle at the left side of the reference voltage line and one trapezoid at the right side of the reference voltage line) shown in the graph shown in the top of FIG. 4B, while the first embodiment equivalently measure the dot-patterned area (consisting of a single large triangle) shown in the graph shown in the top of FIG. 4A. As seen from comparison between FIGS. 4A and 4B, the dot-patterned area shown in the graph shown in the top of FIG. 4B approximates the area under the curved line in the graph shown in the top of FIG. 4B, more precisely than the dot-patterned area shown in the graph shown in the top of FIG. 4A.

Similarly, it is possible to indicate the area more precisely by increasing the number of the voltages supplied for measurement.

Third Embodiment

Next, a measurement example of measuring, in real time, the density of radicals in a pulse-excited plasma by use of in the mass spectrometer in accordance with the present invention, will be described.

As shown in a dotted line in FIG. 3, a pulsed microwave Source is coupled to the plasma source 10, so as to generate a plasma by supplying a microwave electric power in a time modulation of a 10μs on-period per a 100 μs off-period. A gas of $C_4F_8$ was used, and the density of $CF_3$ radicals was measured by a manner similar to the first embodiment shown in FIG. 4A. However, the reference potential was 10.9 V, and the potential for measuring the density of radicals was 12 V (upper limit) in order to avoid $CF_3$ from being produced directly from $C_4F_8$. The measurement was made with a pulse width of 1 μs.

Figure 5:
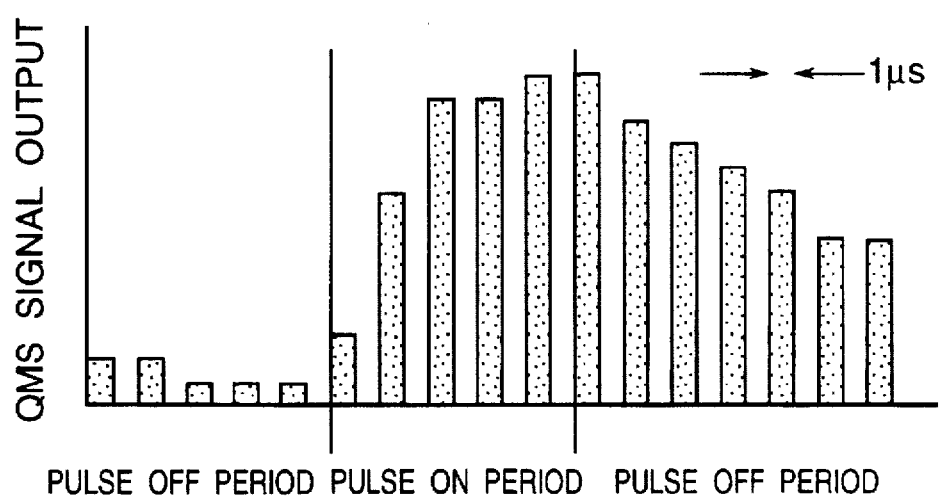
FIG. 5 is a graph illustrating a measurement example of measuring, in real time, the density of radicals in a pulse-excited plasma by use of in the mass spectrometer in accordance with the present invention.

Referring to FIG. 5, there is shown a graph illustrating the strength change of the output signal of the mass spectrometer, corresponding to the CF3 radicals, in one 10 μs on-period and before and after the 10 μs on-period in this measurement example. It has been found from FIG. 5 that, the density of radicals becomes a steady condition for a time of several microseconds, during the on-period of the pulse-excited plasma generated by the pulsed microwave source.

As seen from FIG. 5, the pulse width (1 μs in this third embodiment) is required to be sufficiently shorter than that the on-period for generating a plasma.

As seen from the above, the mass spectrometer in accordance with the present invention is characterized by providing, in the mass spectrometer system, the DC power supply amplifier for a voltage control, which can change the electron beam accelerating voltage for ionization, in the form of a pulse, between the "potential for ionization of radicals" and a "potential slightly lower than the potential for dissociative ionization of parent gas or dissociative ionization of parent radicals". With this arrangement, it is possible to measure the quantity corresponding to the change of the density of radicals, in real time.

In addition, if the method in accordance with the present invention is used for measuring the density of radicals in plasma created by a plasma generating apparatus for an LSI manufacturing, it is possible to evaluate, in real time, the running condition and the degree of stability in an LSI manufacturing apparatus, and therefore, to change the running condition of the LSI manufacturing apparatus if necessary. Accordingly, since it is possible to elevate controllability of the pulse-excited plasma, which is used in for a mass production of semiconductor devices. Therefore, it is possible to stably product a large amount of LSIs, with a reduced yield of production.

The invention has thus been shown and described with reference to the specific embodiments. However, it should be noted that the present invention is in no way limited to the details of the illustrated structures but changes and modifications may be made within the scope of the appended claims.

We claim:

1. A mass spectrometer configured to ionize radicals by an electron beam, and to estimate the amount of said radicals by amplifying secondary electrons generated by collision of ions or electrical charges of said ions themselves, wherein the improvement comprises a DC power supply amplifier provided in a circuit for generating an accelerating voltage of an electron beam for ionizing radicals, and for supplying the electron beam accelerating voltage changing between two different voltages in the form of a pulse.

2. A radical measurement method based on an appearance mass spectrometry of picking up a signal indicative of only radicals in plasma, by bringing an ionizing electron beam accelerating voltage of a mass spectrometer to a potential between the "potential for ionization of radicals" and the "potential for dissociative ionization of parent gas or dissociative ionization of parent radicals", wherein the improvement is that a signal outputted from said mass spectrometer is picked up while repeatedly changing said ionizing electron beam accelerating voltage, in the form of a pulse, between a first voltage not lower than said "potential for ionization of radicals" and a second voltage higher than said first voltage but lower than said "potential for dissociative ionization of parent gas or dissociative ionization of parent radicals", and the density of said radicals is determined from the difference in said signal outputted from said mass spectrometer between when said first voltage is applied and when said second voltage is applied.

3. A radical measurement method based on an appearance mass spectrometry of picking up a signal indicative of only radicals in plasma, by bringing an ionizing electron beam accelerating voltage of a mass spectrometer to a potential between the "potential for ionization of radicals" and the potential for dissociative ionization of parent gas or dissociative ionization of parent radicals, wherein the improvement is that a measurement reference level of said ionizing electron beam accelerating voltage is set to an intermediate voltage between said "potential for ionization of radicals" and a "potential slightly lower than said potential for dissociative ionization of parent gas or dissociative ionization of parent radicals", and thereafter, a signal outputted from said mass spectrometer is picked up while repeatedly changing said ionizing electron beam accelerating voltage, in the form of a pulse, between a first voltage lower than said measurement reference level but not lower than said "potential for ionization of radicals" and a second voltage higher than said measurement reference level but lower than said "potential for dissociative ionization of parent gas or dissociative ionization of parent radicals", and the density of said radicals is determined from the difference in said signal outputted from said mass spectrometer between when said measurement reference level is applied and when said first voltage is applied and from the difference in said signal outputted from said mass spectrometer between when said measurement reference level is applied and when said second voltage is applied.

* * * * *